United States Patent [19]
Sugimoto et al.

[11] Patent Number: 5,747,916
[45] Date of Patent: May 5, 1998

[54] PACKAGED PIEZOELECTRIC TRANSFORMER UNIT

[75] Inventors: Mitsuhiro Sugimoto; Yuji Kondo; Koichi Zama; Yuko Sato, all of Tokyo, Japan

[73] Assignee: NEC Corporation, Tokyo, Japan

[21] Appl. No.: 608,060

[22] Filed: Feb. 28, 1996

[30] Foreign Application Priority Data

Feb. 28, 1995  [JP]  Japan .................. 7-039912

[51] Int. Cl.$^6$ .......................... H01L 41/053; H03H 9/10
[52] U.S. Cl. ................... 310/348; 310/352; 310/359; 310/366
[58] Field of Search .................. 310/344, 348, 310/359, 366, 353, 351, 352

[56] References Cited

U.S. PATENT DOCUMENTS

| | | | |
|---|---|---|---|
| 1,886,792 | 11/1932 | Crossley | 310/348 |
| 2,814,741 | 11/1957 | Minnich et al. | 310/348 |
| 3,790,826 | 2/1974 | Kawada | 310/318 |
| 5,371,430 | 12/1994 | Sato et al. | 310/359 |
| 5,424,602 | 6/1995 | Sato et al. | 310/359 |
| 5,440,195 | 8/1995 | Ohnishi et al. | 310/359 |
| 5,463,266 | 10/1995 | Fukuoka et al. | 310/359 |

FOREIGN PATENT DOCUMENTS

| | | | |
|---|---|---|---|
| 0148361 | 7/1985 | European Pat. Off. | H01L 41/08 |
| 0148361A1 | 7/1985 | European Pat. Off. | H01L 41/08 |
| 2343366 | 9/1997 | France | 310/352 |
| 3927406 | 2/1991 | Germany | 310/359 |
| 0076909 | 5/1982 | Japan | 310/344 |
| 57-138211 | 8/1982 | Japan | H03H 9/02 |
| 59-29820 | 2/1984 | Japan | H03H 9/10 |
| 0066404 | 4/1986 | Japan | 310/344 |
| 0090513 | 5/1986 | Japan | 310/344 |
| 63-30017 | 2/1988 | Japan | H03H 9/09 |
| 2-213210 | 8/1990 | Japan | H03H 9/17 |
| 00294107 | 12/1990 | Japan | 310/348 |
| 4-85823 | 7/1992 | Japan | H03H 9/90 |
| 5-243886 | 9/1993 | Japan | H03H 9/02 |

OTHER PUBLICATIONS

*Patent Abstracts of Japan*, vol. 018, No. 255(E–1548) dated May 16, 1994 corresponding to JP–A–06 037366 (NEC Tohoku Ltd), dated Feb. 2, 1994.

*Patent Abstracts of Japan*, vol. 95, No. 003 corresponding to JP–A–07 079028 (Daishinku Co) dated Mar. 20, 1995.

*Primary Examiner*—Thomas M. Dougherty
*Attorney, Agent, or Firm*—Sughrue, Mion, Zinn, Macpeak & Seas, PLLC

[57] ABSTRACT

In a piezoelectric transformer unit which transforms an input voltage into an output voltage and which includes a piezoelectric transformer element driven by high electric power, a package is provided to accommodate the piezoelectric transformer element therein. Electrodes are attached to nodes of the piezoelectric transformer element and supported by each pair of input and output conductive leads which are operable as leaf springs and which are extended through the package. Contact portions of the conductive leads may provide point contacts, area contacts, and/or line contacts.

6 Claims, 8 Drawing Sheets

PACKAGED PIEZOELECTRIC TRANSFORMER UNIT

BACKGROUND OF THE INVENTION

This invention relates to a piezoelectric transformer unit for transforming an input voltage into an output voltage by the use of a piezoelectric element.

In general, a piezoelectric element is used in a loudspeaker, a microphone, and a crystal cartridge for phono pickups to transform an electric signal into a mechanical force, such as a mechanical vibration and vice versa.

In addition, recent consideration has been made about transforming an input voltage into an output voltage by the use of such a piezoelectric element. In other words, a transformer unit has been proposed which includes the piezoelectric element and which may be called a piezoelectric transformer unit.

Practically, the piezoelectric transformer unit has been often used in a power source circuit, a drive circuit, and the like, instead of an electromagnetic transformer which has a primary coil and a secondary coil. For example, the piezoelectric transformer unit serves to form the drive circuit which drives a cold-cathode fluorescent tube in a liquid crystal display panel of a backlight type, an adapter power source circuit of a usual electric apparatus, and a high voltage generation circuit of an electronic copy machine. This might be that such a piezoelectric transformer unit is not adversely affected by an electromagnetic wave.

As mentioned above, the piezoelectric transformer unit can transform the input voltage into the output voltage like in the electromagnetic transformer unit, in spite of the fact that the piezoelectric element which transforms the electric signal into the mechanical force is included in the piezoelectric transformer unit.

Conventionally, the piezoelectric transformer unit comprises in addition to the piezoelectric element, a plurality of input electrodes attached to the piezoelectric element, a plurality of output electrodes also attached to the piezoelectric element, and a plurality of conductive leads drawn from the respective input and output electrodes. Such combinations of input electrodes and conductive leads may be collectively called a first electrode member while such combinations of output electrode and conductive leads, a second electrode member. The piezoelectric element is polarized in a predetermined orientation to induce the output voltage in response to the input voltage.

Electrical connections have been made so as to assemble such a conventional piezoelectric transformer unit into the power source circuit and the drive circuit like in the electromagnetic transformer unit. In this event, the piezoelectric transformer should be carefully handled because the piezoelectric element is uncovered with any package. Therefore, much skill is required to assemble the conventional piezoelectric transformer unit into the other circuits.

As a rule, usual piezoelectric transducers in a loudspeaker, a microphone, and the like, should be precisely distinguished from the piezoelectric transformer unit according to the present invention in the instant specification and are encapsulated by a wide variety of packages. Such packages for usual piezoelectric transducers have been disclosed in Japanese Unexamined Patent Publication Nos. Sho 57-138, 211 (namely, 138,211/1983); Hei 2-213,210 (namely, 213, 210/1990); Hei 5-243,886 (namely, 243,886/1993); and Japanese Unexamined Utility Model Publications Nos. Sho 63-30,017 (30,017/1988); Sho 59-29,820 (29,820/1984); and Hei 4-85,823 (namely, 85,823/1992).

In order to clear the above-mentioned difficulties encountered on assembling, consideration would be made about an encapsulated piezoelectric transformer unit like the usual piezoelectric transducers.

Herein, it is to be noted that the piezoelectric transformer unit has been included in the power source circuit which develops a high electric voltage. In other words, the piezoelectric element for the piezoelectric transformer unit is inevitably driven by high power of, for example, several watts to accomplish a large vibration level or magnitude. Therefore, the piezoelectric element for the piezoelectric transformer unit must be large in size and heavy in weight as compared with those for the usual piezoelectric transducers. Under the circumstances, it has been found out that the packages which are used for the usual piezoelectric transducers are not suitable for encapsulating the piezoelectric transformer unit.

SUMMARY OF THE INVENTION

It is an object of this invention to provide a piezoelectric transformer unit which is capable of being readily handled on assembling the piezoelectric transformer unit into another circuit, such as a power source circuit.

It is another object of this invention to provide a piezoelectric transformer unit of the type described, which is encapsulated in a package.

It is still another object of this invention to provide a piezoelectric transformer unit of the type described, which is suitable for encapsulating a heavy and large piezoelectric element.

It is yet another object of this invention to provide a piezoelectric transformer unit of the type described, which can favorably withstand an external impact and vibration.

It is another object of this invention to provide a piezoelectric transformer unit of the type described, which is capable of suppressing noise.

It is a specific object of this invention to provide a piezoelectric transformer unit of the type described, which is mechanically strong even when the piezoelectric element is vibrated with a large magnitude.

According to an aspect of this invention, a piezoelectric transformer unit is used for transforming an input voltage into an output voltage and comprises a package which defines a hollow space therein, a piezoelectric transformer element accommodated in the hollow space of the package, a first electrode member extended from the piezoelectric transformer element outside of the package to impress the input voltage, and a second electrode member extended from the piezoelectric transformer element outside of the package to generate the output voltage.

According to another aspect of this invention, the first electrode member comprises a plurality of input electrodes attached to the piezoelectric transformer element, and a plurality of input conductive leads electrically connected to the input electrodes and extended through the package outside of the package while the second electrodes member comprises a plurality of output electrodes attached to the piezoelectric transformer element and remote from the input electrodes and a plurality of output conductive leads electrically connected the output electrodes and extended through the package outside of the package. The package comprises at least one projection extended towards the piezoelectric transducer element.

DESCRIPTION OF THE PREFERRED EMBODIMENTS

Figure 1:
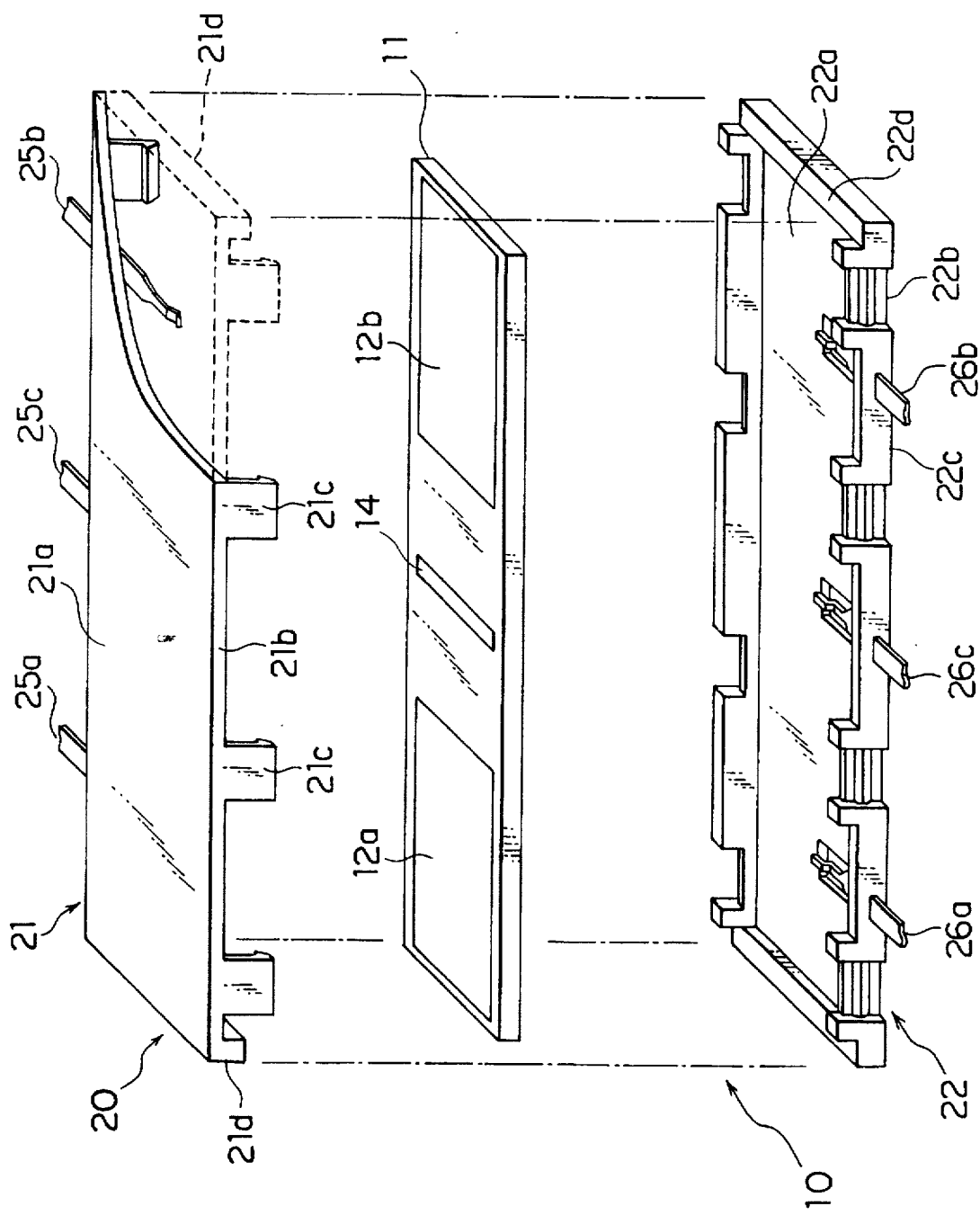
FIG. 1 is a perspective view of a piezoelectric transformer unit according to a first embodiment of this invention.

Referring to FIG. 1, a piezoelectric transformer unit according to a first embodiment of this invention includes a piezoelectric transformer element 11 which will be called a piezoelectric transformer element hereinunder and which may be, for example, NEPEC 8 manufactured and sold by Tokin Corporation, Sendai, Japan. The piezoelectric transformer element 11 has a rectangular parallelepiped shape defined by a length, a width, and a thickness, as shown in FIG. 1 and is practically 42.0 mm long, 10.0 mm wide, and 1.0 mm thick. Herein, the piezoelectric transformer element 11 of the rectangular parallelepiped shape is defined by a front surface directed upwards of FIG. 1, a back surface directed downwards, a front side surface directed forwards, a back side surface directed backwards, a lefthand side surface, and a righthand side surface.

A first pair of input electrodes 12a is attached on a lefthand side area of each of the front and the back surfaces of the piezoelectric transformer element 11 and is opposite to each other, although no illustration is made about the input electrode of the first pair attached to the back surface of the piezoelectric transformer element 11. A second pair of input electrodes 12b is attached on a righthand side area of each of the front and the back surfaces of the piezoelectric transformer element 11 and is opposite to each other. As shown in FIG. 1, the input electrode 12a and 12b of the first and the second pairs are remote from each other on the front and the back surfaces.

A pair of output electrodes 14 is attached onto a center area of each of the front and the back surfaces of the piezoelectric transformer element 11 and is opposite to each other. The output electrodes 14 are distant from the first and the second pairs of the input electrodes 12a and 12b.

The first and the second pairs of the input electrodes 12a and 12b and the output electrode pair 14 are formed by patterning thick film paste of AgPd by the use of a screen printing technique and by firing a patterned sheet. Thereafter, the piezoelectric transformer element 11 is polarized. Such first and second pairs of input electrodes 12a and 12b and output electrodes 14 are placed at positions at which nodes of mechanical vibration would appear on the piezoelectric transformer element 11. As a result, the piezoelectric transformer element 11 is of a symmetrical third order Rosen type which can operate in a third order longitudinal vibration mode.

The illustrated piezoelectric transformer element 11 is packaged within a package 20 which includes an upper case 21 and a lower case 22 each of which is composed of a synthetic resin material of, for example, VECTORA A-130, manufactured and sold by Nippon Polyplastic Company Limited. The upper case 21 is fitted with the lower case 22 with a hollow space or an inner cavity left within the upper and the lower cases 21 and 22. Consequently, the piezoelectric transformer element 11 is encapsulated within the hollow space of the package 20 when the upper and the lower cases 21 and 22 are mechanically joined together. As readily understood from FIG. 1, each of the upper and the lower cases 21 and 22 has a length direction or a predetermined direction between the lefthand side of FIG. 1 and the righthand side thereof while a width direction is perpendicular to the length direction and is defined by a direction from the front side to the back side of FIG. 1. Moreover, a thickness direction is defined in a direction perpendicular to the length and the width directions.

More specifically, the upper case 21 includes a flat panel portion 21a, front and back side edge portions 21b directed downwards from the flat panel portion 21a, projections 21c projected downwards from the front and the back side edge portions 21b in a predetermined length, and lefthand and righthand side ends 21d directed downwards and extended between the front and the back side edge portions 21b.

On the other hand, the lower case 22 includes a flat bottom portion 22a, front and back side clamp portions 22b clamped with the projections 22b, side wall portions 22c contiguous to the front and the back side clamp portions 22b, and lefthand and righthand side end contact portions 22d mechanically contacted with the lefthand and the righthand side ends 21d of the upper case 21. In addition, the flat bottom portion 22a has three parallel openings formed at a middle portion of the flat bottom portion 22a. With this structure, the upper and the lower cases 21 and 22 can be manually fitted with each other by snap fitting and can be readily assembled together.

Thus, the package 20 itself is formed only by the upper and the lower cases 21 and 22 and is therefore very simple in structure. Practically, the package 20 has a size of 45.0×13.0×3.3 mm.

Furthermore, three upper conductive leads 25a, 25b, and 25c are extended through the back side edge portions 21b from the back side of the package 20 towards the front side. Likewise, three lower conductive leads 26a, 26b, and 26c are extended through the side wall portions 22c in the width direction from the front side of FIG. 1 towards the back side. The lower conductive leads 26a, 26b, and 26c have inner ends located over the three parallel openings formed in the flat bottom portion 22a and outer ends placed outside of the package 20.

Each of the upper and the lower conductive leads 25a to 25c and 26a to 26c is composed of phosphor bronze plated with tin. Like the lower conductive leads 26a to 26c, each of the upper conductive leads 25a to 25c has a shaped inner end contacted with each of the electrodes 12a, 12b, and 14 and an outer end placed outside of the package 20, as will be described later in detail.

Each of the upper and the lower conductive leads 25a to 25c and 26a to 26c is mold inserted through the back side edge portions 21b and the side wall portions 22c into the hollow space of the package 20. The outer ends of the upper and the lower conductive leads 25a to 25c and 26a to 26c are bent shaped by the use of a mold into a predetermined configuration. Thus, the piezoelectric transformer unit 10 can be electrically connected to an external circuit to form a power source circuit or the like.

Figure 2:
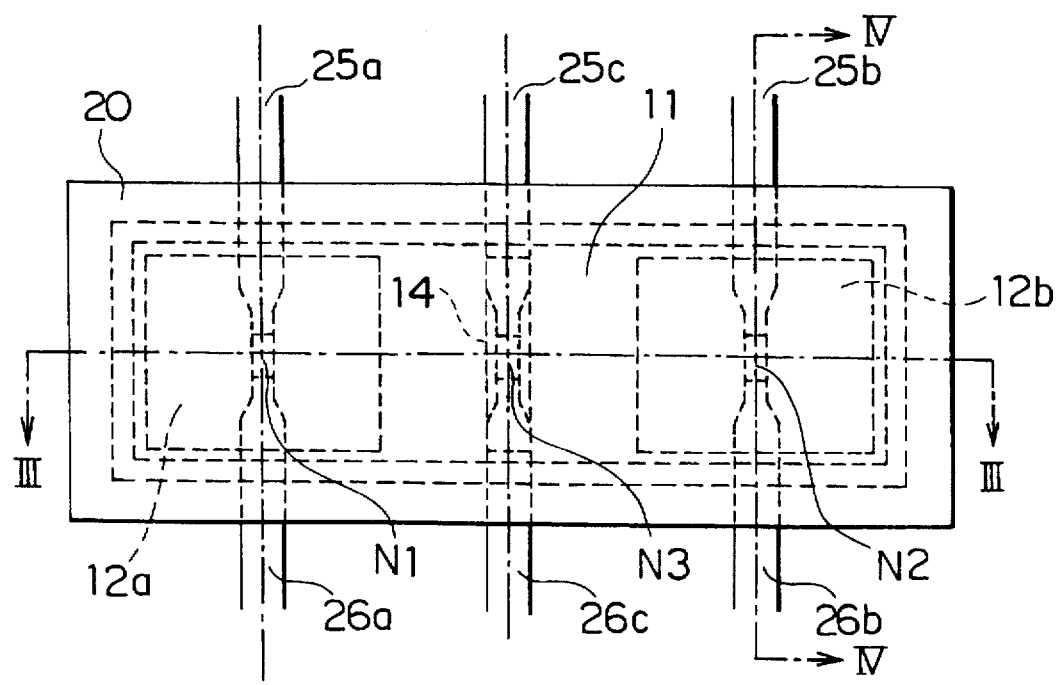
FIG. 2 is a plan view of the piezoelectric transformer unit illustrated in FIG. 1.
Figure 3:
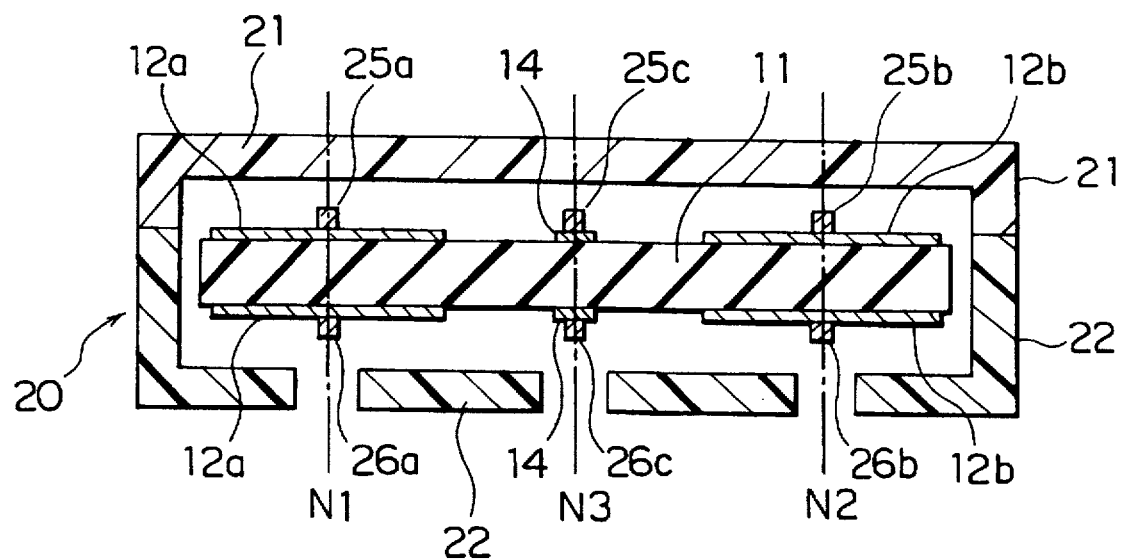
FIG. 3 is a sectional view of the piezoelectric transformer unit illustrated in FIG. 1 taken along a line of III—III.
Figure 4:
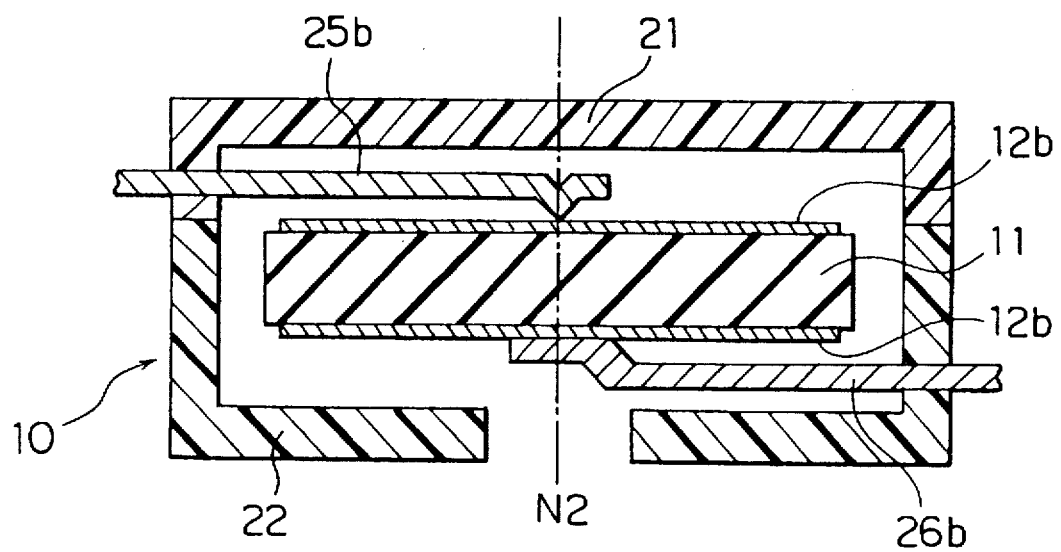
FIG. 4 is a sectional view of the piezoelectric transformer unit illustrated in FIG. 1 taken along a line of IV—IV.

Referring to FIGS. 2 to 4, three of the nodes depicted in N1, N2, and N3 in FIGS. 2 and 3 appear on the front and the back surfaces of the illustrated piezoelectric transformer element 11 where a drive signal of a drive frequency is given. As shown in FIGS. 2 and 3, the first and the second pairs of the input electrodes 12a and 12b and the output electrodes 14 are laid on the piezoelectric transformer element 11 so that each electrode covers each of the nodes N1 to N3. In addition, the upper and the lower conductive leads 25a to 25c and 26a to 26c are attached onto the nodes N1 to N3, respectively. As shown in FIG. 3, the openings are located in the lower case 22 under the respective lower conductive leads 26a to 26c. As a result, the illustrated piezoelectric transformer element 11 is pressed or supported from both the front and the back surfaces by the upper and the lower conductive leads 25a to 25c and 26a to 26c at the same positions as the nodes N1 to N3.

As exemplified in FIG. 4, the upper conductive lead 25b is extended through the upper case 21 rightwards of FIG. 4 and is brought into contact with the input electrode 12b formed on the front surface of the piezoelectric transformer element 11. On the other hand, the lower conductive lead 26b is extended through the lower case 22 leftwards and is brought into contact with the input electrode 12b formed on the back surface of the piezoelectric transformer element 11.

From FIGS. 3 and 4, it is readily understood that the upper and the lower conductive leads 25b and 26b are extended in opposite directions to each other and are placed at different heights. In addition, it is to be noted that the shaped inner end of the upper conductive lead 25b has a configuration different from that of the lower conductive lead 26b.

Figure 5A:
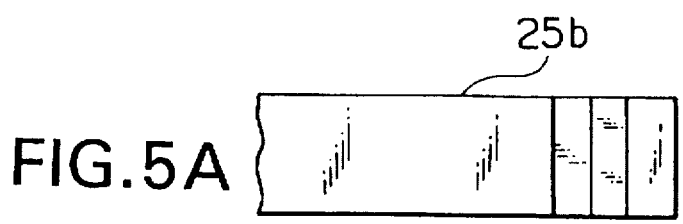
FIGS. 5(a) and 5(b) are a plan view and a side view of a conductive lead illustrated in FIG. 4, respectively.
Figure 5B:
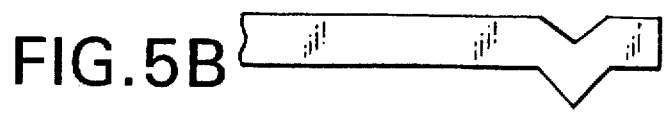

Temporarily referring to FIGS. 5(1) and (b) together with FIG. 4, the shaped inner end of the upper conductive lead 25b is bent in the form of a ridge which is extended along a line of 0.5 mm wide and which is directed downwards of FIG. 4. Consequently, the line contact is provided with the input electrode 12b.

As mentioned in conjunction with FIGS. 1, 3, and 4, the openings are formed in the lower case 22 under the shaped inner ends of the lower conductive leads 26a, 26b, and 26c. Such openings are very helpful to radiate head which is generated at contact portions between the shaped inner ends and the electrodes. Moreover, such openings serve to allow cleaning of the hollow space or the cavity of the package 20 by a cleaning solvent and to evacuate the cleaning solvent on drying.

Referring back to FIG. 4, the shaped inner end of the lower conductive lead 26b has a rectangular shape of 0.5×1.0 mm and provide a face contact.

Practically, each of the upper and the lower conductive leads, such as 25b and 26b, acts as a leaf spring which has a fixed or supporting point molded by each of the upper and the lower cases 21 and 22. This means that the piezoelectric transformer element 11 is supported by three pairs of leaf springs contacted with the front and the back surfaces of the piezoelectric transformer element 11. Herein, it is preferably that the leaf springs of each pair have the same spring constant, although this invention is not always restricted to the leaf springs which are substantially equal to each other in the spring constant.

The upper and the lower conductive leads, such as 25b and 26b, can be obtained by a very simple bending process. This structure enables improvement of precision in the bending process and excellent durability in the leaf springs. In addition, such a simple structure of each of the upper and the lower conductive leads, such as 25b and 26b, can be readily designed and manufactured with narrow variation.

In fact, the upper and the lower conductive leads are attached to upper and lower lead frames while the upper and the lower cases 21 and 22 are manufactured by molding. The above-mentioned leads facilitate to design the lead frame and a mold for the upper and the lower cases 21 and 22, which serves to reduce a manufacturing cost.

As regards the structure of the lead springs formed by the upper and the lower conductive leads, the piezoelectric transformer element 11 is stably supported by the upper and the lower conductive leads against an external impact or shock because each of the lower conductive leads provides the face contact. Inasmuch as the piezoelectric transformer element 11 is interposed between the upper and the lower conductive leads which have substantially equal spring constants, contact portions between the leads and the electrodes are stably kept due to the leaf springs symmetrical position with respect to the piezoelectric transformer element 11 even when a mechanical shock is imposed on the piezoelectric transformer element 11 from either an upper direction or a lower direction.

Herein, the piezoelectric transformer unit 10 should assure an electric characteristic and a mechanical characteristic because the piezoelectric transformer element 11 is vibrated with a large magnitude in comparison with the usual piezoelectric elements. Specifically, the contact portions between the leads and the electrodes should be firmly held against such a large vibration without an energy conversion loss.

To this end, the piezoelectric transformer unit 10 according to the first embodiment of this invention has been tested to check the electric and the mechanical characteristics in the following manner.

On testing the electric characteristics, an a.c. voltage which has a drive frequency of about 115 kHz has been impressed onto an input side of the piezoelectric transformer unit 10, with a dummy load connected to an output side. In this event, the dummy load is assumed to be a cold-cathode fluorescent tube and is composed of a parallel circuit of a resistor of 100 kiloohms and a capacitor of 15 pF. Under the circumstances, a lighting test has been simulated in connection with the piezoelectric transformer unit 10 to measure input and output electric currents and voltage, electric power, and exoergic temperatures of the piezoelectric transformer unit 10.

On testing the mechanical characteristic, a vibration test and an impact test have been carried out in connection with the piezoelectric transformer unit 10. On the vibration and the impact tests, an orthogonal coordinate is determined along the length direction, the width direction, and the thickness direction of the piezoelectric transformer element 11. Specifically, an x-axis, a y-axis, and a z-axis of the orthogonal coordinate are determined along the length, the width, and the thickness directions, respectively. Practically, the vibration test has been carried out at 2 to 5 G along each of the x-, the y-, and the z-axes while the impact test has been made at 20 to 100 G for 11 milliseconds along each of the x-, the y-, and the z-axes.

Before and after each of the vibration and the impact tests, variations of the electric characteristics have been measured. Furthermore, an impact lighting test has also been made at 20 to 100 G for 11 milliseconds along the x-, the y-, and the z-axes. During the impact lighting test, the piezoelectric transformer unit 10 has been driven and the cold-cathode fluorescent tube has been lightened to check whether or not a lighting state has been instantaneously interrupted due to an opened state between the contact portions and the conductive leads.

Among the electric characteristics of the piezoelectric transformer unit 10, a power conversion efficiency is important which is calculated from a relationship between the input electric power and the output electric power. Preferably, the power conversion efficiency is high in the light of saving power of a battery. For this purpose, it is preferable that a pressing force between the conductive leads and the electrodes of the piezoelectric transformer element 11 is weak and that contact areas between the conductive leads and the piezoelectric transformer element are small.

According to the inventors' experimental studies, it has been found out that a high power conversion efficiency has been accomplished when the pressing force of the conductive leads is not greater than 120 grf at every contact for a unit weight of the piezoelectric transformer element 11. Actually, only 0.5% of the power conversion efficiency has been reduced as compared with the case where no pressing force has been impressed between the conductive leads and the piezoelectric transformer element 11.

However, when the pressing force exceeds 120 grf, the power conversion efficiency has been drastically reduced and the exoergic temperature has concurrently risen at the contact portions between the leads and the electrodes. As a result, the vibration of the piezoelectric transformer element 11 has ben adversely affected due to the high temperature of the contact portions.

On the other hand, when a rate of the face contacts between the electrodes and the conductive leads does not exceed 0.5% of a total area of either one of the front and the back surfaces of the piezoelectric transformer element 11, the power conversion efficiency has been reduced only by 0.5% in comparison with the case where no pressing force has been impressed. Thus, a high power conversion efficiency has been achieved by reducing the areas of the contact portions. To the contrary, when the rate of the face contacts exceeds 0.5%, the power conversion efficiency has been intensely reduced and the temperature has been increased at the contact portions of the piezoelectric transformer element 11 like in the above.

During the impact lighting test, it is preferable that any flickering does not take place on the cold-cathode fluorescent tube by a slight vibration which might be usually given to the piezoelectric transformer unit 10. This is because, even when the cold-cathode fluorescent tube flickers at a period of, for example, several tens of milliseconds, an operator feels uncomfortable.

Under the circumstances, it has been confirmed that the contact portions between the conductive leads and the piezoelectric transformer element 11 are kept stable against the external vibration and the impact or shock on the condition that the pressing force of the conductive leads is not smaller than 120 grf at each contact portion for the unit weight of the piezoelectric transformer element 11. In any event, it has been confirmed that the contact portions can favorably withstand the external shock which is equal to or greater than 20 G.

Taking the above into consideration, the piezoelectric transformer unit 10 according to the first embodiment of this invention preferably has the pressing force between 20 and 120 grf at each contact portion for the unit weight of the piezoelectric transformer element 11. In addition, the rate of the face contact of every contact portion relative to the back surface is selected at a range which is not greater than 0.5%.

As long as the piezoelectric transformer element 11 is held by the conductive leads within the above-mentioned ranges of the pressing force and the rate of the face contact, the piezoelectric transformer element 11 can be freely moved in the hollow space of the package 20 within a predetermined clearance even when the external impact or shock is given to the piezoelectric transformer unit 10. This makes it possible to minimize an external stress and a thermal shock or stress and enables improvement of the power conversion efficiency.

Excellent results have been attained as regards the electric and the mechanical characteristics other than the power conversion efficiency and the impact lighting test.

In the example being illustrated, the conductive leads 25 and 26 of phosphor bronze have been exemplified. However, 42 nickel alloy, brass, beryllium copper, or the like may be used instead of phosphor bronze. In lieu of the tin plating, nickel plating, indium plating, lead alloy tin plating, gold plating, palladium plating, or their composite plating may be carried out to form the conductive leads. Especially, the nickel plating has been effective in comparison with the tin plating.

As a mold resin material, Vectora A-130 which has been known as a liquid crystal polymer has been exemplified to provide the upper and the lower cases 21 and 22 in the above example. However, the mold resin material may be either another liquid crystal polymer, such as SumikaSuper (manufactured and sold by Sumitomo Chemical Company Limited, Osaka, Japan), NOVACCURATE (manufactured and sold by Mitsubishi Kasei Corporation, Tokyo, Japan), or a polyphenylene sulfide resin.

Figure 6A:
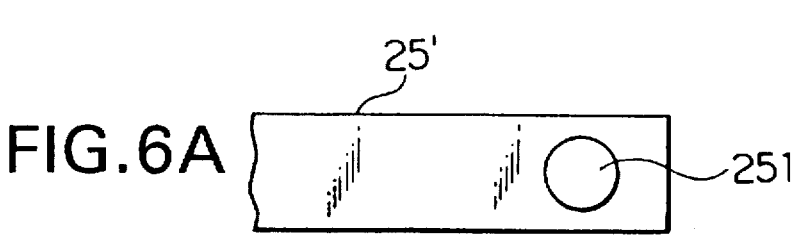
FIGS. 6(a) and 6(b) are a plan view and a side view of another conductive lead which can be used in FIG. 4, respectively.
Figure 6B:

Referring to FIGS. 6(a) and (b) together with FIG. 4, another shaped inner end of the upper conductive lead 25' is exemplified on the assumption that the shaped inner end of the lower conductive lead, such as 26b, provides the face contact, as mentioned in conjunction with FIG. 4. In FIGS. 6(a) and (b), a semispherical portion 251 is formed at the illustrated shaped inner end of the upper conductive lead 25' to provide a point contact between the upper conductive lead 25 and the electrode, such as 12b. This structure can reduce a contact area in comparison with that of FIGS. 5(a) and (b) providing the line contact. Such a reduction of a contact area may be also accomplished by processing a surface on the inner end of the upper conductive lead into a mesh form or the like.

Figure 7A:
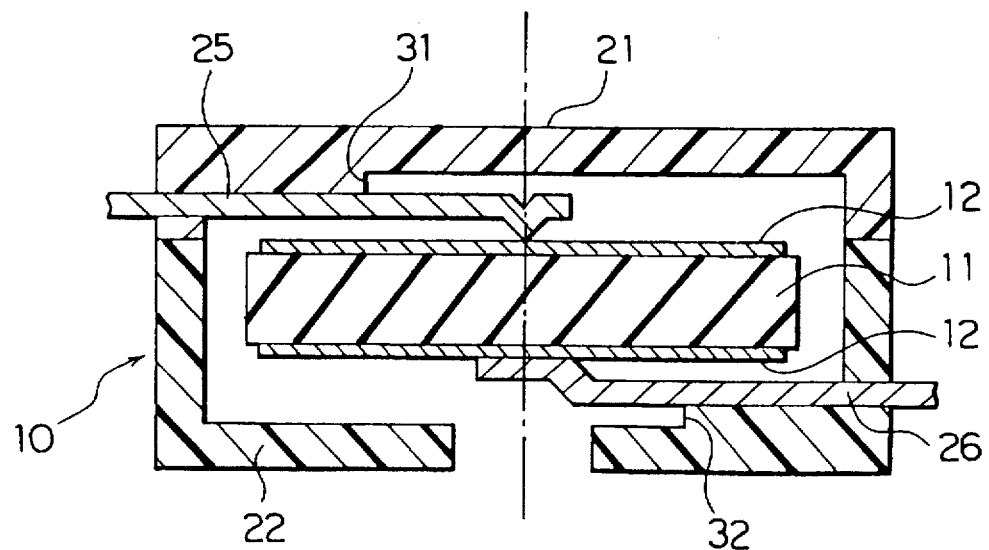
FIGS. 7(a) and 7(b) are sectional views of a piezoelectric transformer unit according to a second embodiment of this invention to describe a structure and an operation, respectively.
Figure 7B:
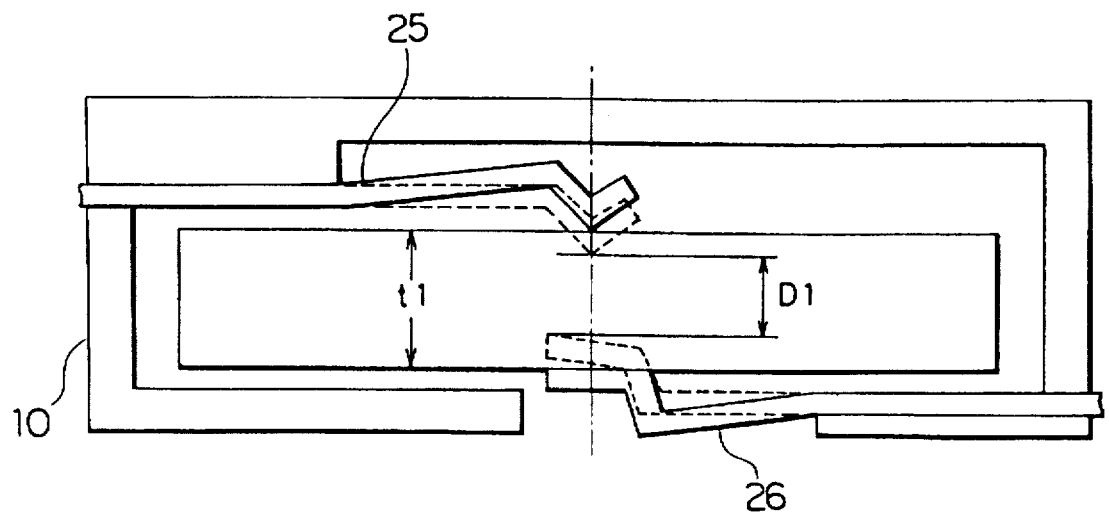

Referring to FIG. 7(a), a piezoelectric transformer unit according to a second embodiment of this invention is similar in structure except that the upper and the lower cases 21 and 22 are somewhat changed from those illustrated in FIG. 4. More specifically, the upper and the lower cases 21 and 22 have inside plateau portions 31 and 32 which are partially projected downwards and upwards of FIG. 7 within the hollow space and which are integral with the other portions of the upper and the lower cases 21 and 22. The inside plateau portions 31 and 32 are adjacent and contiguous to the side walls of the upper and the lower cases 21 and 22.

In the illustrated example, the upper and the lower conductive leads 25 and 26 (suffixes omitted) are extended through the side walls of the upper and the lower cases 21 and 22 and are partially laid on the inside plateau portions 31 and 32. In other words, the upper conductive lead 25 has an upper surface contacted with and supported by the upper case 21 while the lower conductive lead 26 has a lower surface contacted with and supported by the lower case 22. At any rate, the upper and the lower cases 21 and 22 serve to fix the upper and the lower conductive leads 25 and 26 not only by the side walls but also by the inside plateau portions by molding, respectively.

With this structure, it is possible to heighten an eigen frequency of a primary mode of each conductive lead to a frequency higher than an audible frequency. This shows that the eigen frequency of the illustrated conductive lead is higher than that illustrated in conjunction with FIGS. 1 through 4.

Practically, a noise level (specified by a sound pressure level: A characteristic) has been measured in connection with the piezoelectric transformer unit 10 illustrated in FIG. 7(a), with the unit 10 driven and vibrated with a large magnitude, like in the first embodiment. Consequently, it has been found out in the second embodiment that the noise level is improved by about 3 dB in comparison with the first embodiment. This might be based on the fact that the vibration of the piezoelectric transformer element 11 is directly transmitted to the conductive leads 25 and 26.

Actually, a laser doppler measurement has been made to confirm the vibrations of the conductive leads and the vibration of the package 20. Results of the measurement have shown that the vibration level of the conductive leads is slightly greater than the vibration level of the package 20. This means that the piezoelectric transformer unit 10 of a lower noise level can be accomplished by heightening the eigen frequency of the primary mode of the conductive leads, such as 25, 26, to a frequency higher than the audible frequency. In addition, it has been confirmed that the illustrated unit 10 has electric and mechanical characteristics similar to those of the first embodiment.

Herein, it has been found out that the upper and the lower conductive leads 25 and 26 which act as the leaf springs should be deformed within a preselected range in a direction along the z-axis to avoid detachment of the upper and the lower conductive leads 25 and 26 from the piezoelectric transformer element 11. Taking this into account, a pressing stroke of the upper and the lower conductive leads 25 and 26 has been considered so as to avoid such detachment of the conductive leads 25 and 26 with reference to FIG. 7(b) and to assure a mechanical strength of the conductive leads 25 and 26 against a mechanical shock or impact. This results in assuring a lift time of the piezoelectric transformer unit 10.

Herein, the pressing stroke is defined by a relationship between the thickness t1 of the piezoelectric transformer element 11 and a gap D1 which is left between the contact portions of the upper and the lower conductive leads 25 and 26 when the piezoelectric transformer element 11 is not placed within the package 10. More specifically, the pressing stroke is given by (t1-D1) and is specified by a repulsive distance of both the upper and the lower conductive leads.

According to the inventors' experimental studies, it is preferably that the pressing stroke is equal to 0.5 mm or so.

In addition, when each spring constant of the upper and the lower conductive leads 25 and 26 is substantially equal to each other, it is possible to maximize the pressing stroke in the direction of the z-axis. This shows that the piezoelectric transformer unit 10 is very strong against the mechanical shock.

Figure 8A:
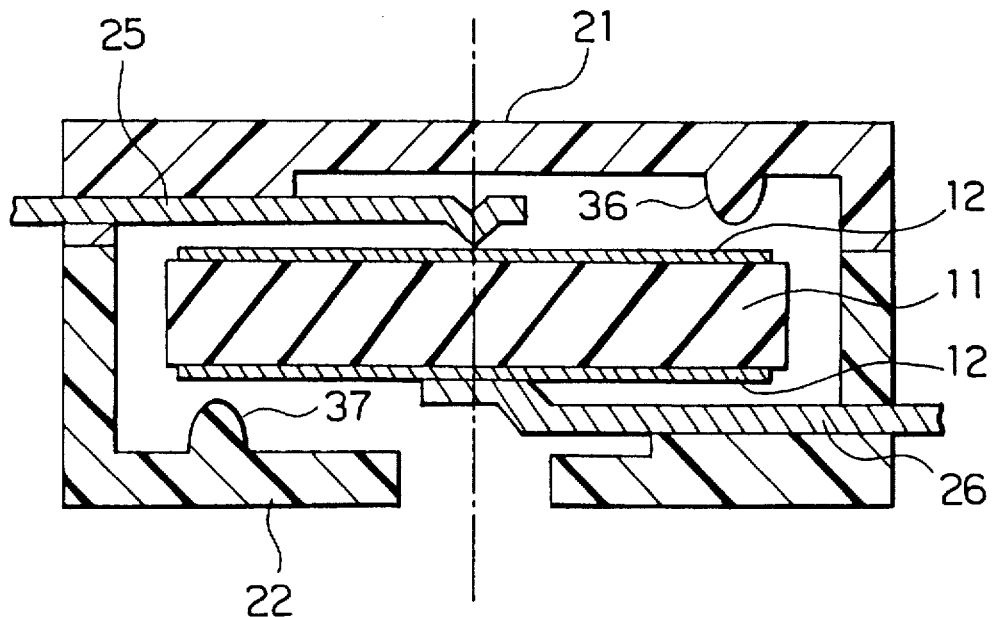
FIGS. 8(a) and 8(b) are sectional views of a piezoelectric transformer unit according to a third embodiment of this invention and a modification of the third embodiment, respectively.

Referring to FIG. 8(a), a piezoelectric transformer unit 10 according to a third embodiment of this invention is similar in structure to that illustrated in FIG. 7 except that the upper and the lower cases 21 and 22 have first and second mold projections 36 and 37 which are directed downwards and upwards of FIG. 8 from the inside flat surface of the upper case 21 and the inside bottom surface of the lower case 22, respectively.

As regards the piezoelectric transformer unit 10, a mechanical movement might occur due to the spring characteristic of the conductive leads 25 and 26 when a strong mechanical shock or impact is imposed on the piezoelectric transformer unit 10. Taking the above into consideration, the first and the second mold projections 36 and 37 serve to restrict the mechanical movement of the piezoelectric transformer element 11.

In FIG. 8(a), each of the first and the second mold projections 36 and 37 has a round configuration in cross section, a diameter of 1.0 mm, and a height of 0.4 mm. With this structure, a sum of clearances between the piezoelectric transformer element 11 and each of the projections 36 and 37 may preferably fall with a range between 0.1 mm and 0.2 mm.

Figure 8B:
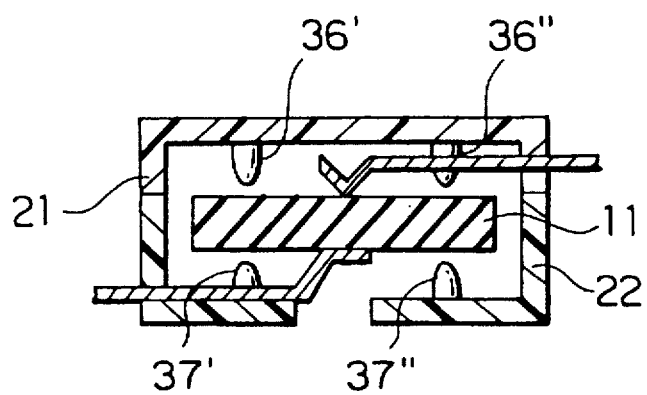

Referring to FIG. 8(b), a piezoelectric transformer unit 10 according to a modification of the third embodiment of this invention illustrated in FIG. 8(a) is similar in structure to that illustrated in FIG. 8(a) except that two of the first projections 36' and 36" are protruded downwards from the upper case 21 while two of the second projections 37' and 37" are protruded upwards from the lower case 22. Each of the first and the second projections 36', 36", 37', and 37" has a height of, for example, 0.4 mm, with the sum of the above-mentioned clearances kept at 0.15 mm.

Anyway, such projections, 36, 37, 36' to 37". serve to restrict rotational movement of the piezoelectric transformer element 11 and to suppress an irregular vibration of the piezoelectric transformer element 11 due to displacement of the contact portions. Moreover, it has been confirmed that a noise level has been reduced by using the piezoelectric transformer unit 10 illustrated in FIGS. 8(a) and (b).

Figure 9:
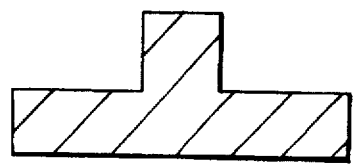
FIG. 9 is a sectional view of a projection which can be used in FIGS. 8(a) and 8(b)

Alternatively, each of the first and the second mold projections 36 and 37 may have a cylindrical configuration in cross section, as shown in FIG. 9. The illustrated cylindrical projection has a diameter of 1.0 mm and a height of 0.4 mm.

Figure 10:
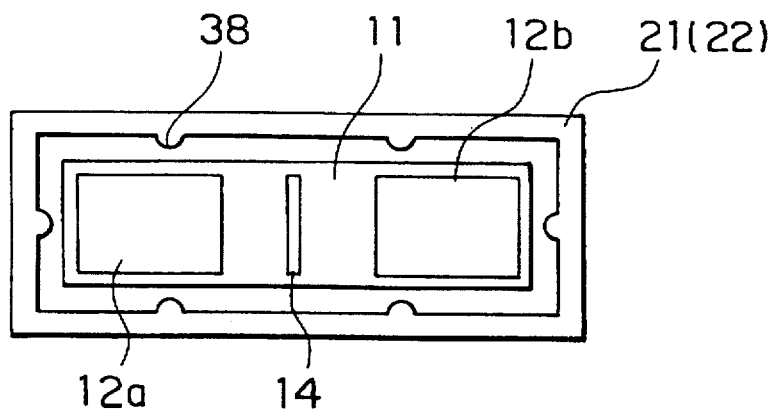
FIG. 10 is a plan view of another piezoelectric transformer unit according to this invention.

In FIG. 10, a plurality of small projections 38 may be distributed within the inside of the upper or the lower case 21 or 22 along a periphery of the piezoelectric transformer element 11. The small projections 38 are helpful to restrict an outward movement of the piezoelectric transformer element 11 and may have a semispherical configuration and a diameter of 0.2 mm in cross section.

Practically, each of the small projections 38 arranged along the length direction of the piezoelectric transformer element 11 is extended in a cylindrical shape in a direction perpendicular to this paper and is directed within this paper towards the piezoelectric transformer element 11 with gaps left between the small projections 38 and both front and back side surfaces of the piezoelectric transformer element 22. A sum of the gaps is selected within a range between 0.1 and 0.2 mm. When the sum of the gaps becomes equal to 0.2 mm, a variation of the power conversion efficiency has been reduced only by less than 0.3%.

The piezoelectric transformer unit 10 illustrated in FIG. 8(a) has been subjected to electric and mechanical tests mentioned in conjunction with the first and the second embodiments. As a result, it has been confirmed that the illustrated piezoelectric transformer unit 10 exhibits an improved level of 100 G or more on the impact lighting test and that neither chipping nor cracking takes place in the piezoelectric transformer element 11 even when a mechanical shock is imposed on the piezoelectric transformer unit 10. Similar results have been obtained in the electric and the mechanical tests like in the first and the second embodiments.

In any event, it is noted that the nodes N1 to N3 shown in FIGS. 2 and 3 are not completely fixed, which serves to avoid an influence of the thermal shock and to accomplish a high power conversion efficiency.

Figure 11A:
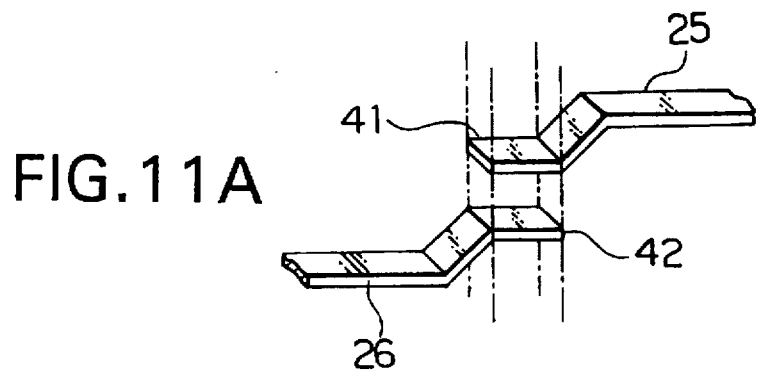
FIGS. 11(a), (b), (c), and (d) are perspective views of conductive leads which can be used in the piezoelectric transformer unit according to this invention.

Referring to FIGS. 11(a), (b), (c), and (d), modifications are exemplified as regards combinations of upper and lower conductive leads 25 and 26. In FIG. 11(a), each of the upper and the lower conductive leads 25 and 26 has flat inner ends 41 and 42 to support the piezoelectric transformer element 11 (not shown in this figure). With this structure, the contact portions between the piezoelectric transformer element 11 and each of the upper and the lower conductive leads 25 and 26 provide face contacts. This structure serves to avoid an undesirable movement of the piezoelectric transformer element 11 and the contact portions against the mechanical shock within the hollow space of the package 10. In other words, it is possible with this structure to improve reliability of the contact portions because contact areas between the flat inner ends 41 and 42 and the piezoelectric transformer element becomes wide.

Figure 11B:
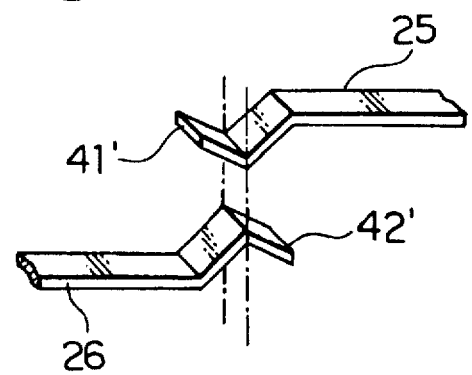

In FIG. 11(b), each of the upper and the lower conductive leads 25 and 26 has angular inner ends 41' and 42' brought into contact with the piezoelectric transformer element 11. The contact portions between the piezoelectric transformer element 11 and each of the upper and the lower conductive leads 25 and 26 provide line contacts which serve to avoid an undesirable movement of the piezoelectric transformer element 11 against an external mechanical shock. This structure can prevent the vibration of the piezoelectric transformer element 11 from being unfavorably suppressed by the contact portions.

Figure 11C:
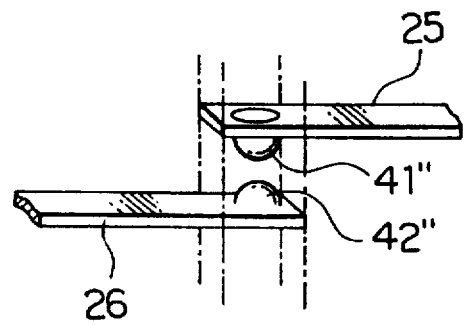

In FIG. 11(c), the upper and the lower conductive leads 25 and 26 have semicircular inner ends 41" and 42" to provide point contacts between the piezoelectric transformer element 11 and each of the upper and the lower conductive leads 25 and 26. Such point contacts serve to avoid an undesirable movement of the piezoelectric transformer element 11 even when a mechanical shock is imposed on the piezoelectric transformer unit 10 and to prevent the vibration of the piezoelectric transformer element 11 from being unfavorably suppressed by the contact portions. With this structure, it is possible to minimize contact areas between the inner ends 41" and 42" and the piezoelectric transformer element. This means that the vibration of the piezoelectric transformer element is not adversely affected by the contact portions and that the power conversion efficiency therefore becomes maximum.

Figure 11D:
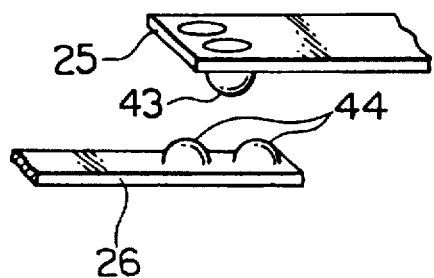

In FIG. 11(d), the upper conductive lead 25 has a pair of semicircular protrusions 43 which are arranged in parallel in a width direction of the upper conductive lead 25 so that the node is interposed between the semicircular protrusions 43.

On the other hand, the lower conductive lead 26 has a pair of semicircular protrusions 44 which are arranged in series along a length direction of the lower conductive lead 26 so that the node is interposed between the semicircular protrusions 44.

The piezoelectric transformer element 11 is supported on the front and the back surfaces by four point contacts formed around the node. This structure serves to avoid an unfavorable movement of the piezoelectric transformer element 11 against the mechanical shock and to prevent the vibration of the piezoelectric transformer element 11 from being unfavorably suppressed. With this structure, a high reliability of the contact portions can be achieved because the piezoelectric transformer element 11 is supported by the four points. In addition, the power conversion efficiency is also improved because each of the four points has a very small area and never impedes the vibration of the piezoelectric transformer element 11.

Herein, it is to be noted that a wide variety of considerations must be made about the packaged piezoelectric transformer unit 10 because the piezoelectric transformer unit 10 is driven by high electric power, as mentioned before. For example, the conductive leads 25 (26) would readily come off the upper and the lower cases 21 and 22 due to a mechanical vibration of a large magnitude.

Figure 12:
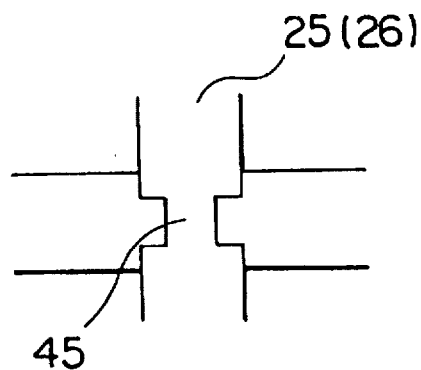
FIG. 12 is a plan view for use in describing a preferably relationship between a conductive lead and a package according to his invention.

In order to prevent each of the upper and the lower conductive leads 25 and 26 from coming off each of the upper and the lower cases 21 and 22, a notch portion or a narrow portion 45 is formed at a middle portion of each of the upper and the lower conductive leads 25 and 26, as illustrated in FIG. 12. In FIG. 12, the notch portion 45 is molded by a synthetic resin which forms each of the upper and the lower cases 21 and 22. With this structure, it is possible to improve a tensile strength of each conductive lead and to firmly fix each conductive lead to the package. Practically, the tensile strength has been increased to more than 5 kgf when the notch portion 45 has been formed, in spite of the fact that the tensile strength is about 1 kgf in the absence of the notch portion 45.

In order to avoid generation of an audible noise, consideration has been also directed to the contact portions of the lower conductive lead 26 with the piezoelectric transformer element 11. This is because such an audible noise is generated on the basis of a difference between an eigen frequency of the lower conductive lead 26 and a drive frequency of the piezoelectric transformer element 11. Practically, the drive frequency of the piezoelectric transformer element 11 becomes equal to 115 kHz or so. This shows that the eigen frequency of the lower conductive lead 26 should be separated by at least 20 kHz from the drive frequency to avoid occurrence of a beat tone and, otherwise, the beat tone inevitably occurs in the form of the audible noise from the piezoelectric transformer unit 10.

Figures 13A, 13B:
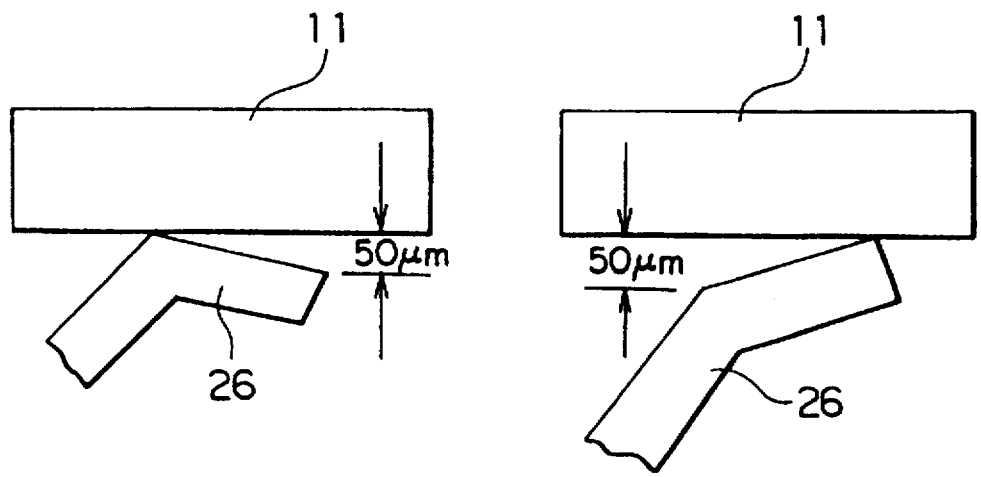
FIGS. 13(a) and 13(b) are enlarged side view for use in describing contact portions of the conductive lead.

Taking the above into consideration, the lower conductive lead 26 is brought into contact with the piezoelectric transformer element 11 at a designed angle, as shown in FIGS. 13(a) and 13(b).

In FIG. 13(a), an extremity of the inner end portion of the lower conductive lead 26 is remote from the piezoelectric transformer element 11 with the contact portion somewhat distant from the extremity of the lower conductive portion 26. In this event, it has been observed that no audible noise occurs when the extremity of the lower conductive lead 26 is remote from the piezoelectric transformer element 11 by a distance which is not greater than 50 micrometers. On the other hand, when the extremity of the lower conductive lead 26 is brought into contact with the piezoelectric transformer element 11, as shown in FIG. 13(b), a bending portion of the lower conductive lead 26 should also be remote from the piezoelectric transformer element 11 by a distance which is not greater than 50 micrometers.

At any rate, the eigen frequency of the lower conductive lead 26 must be shifted from the drive frequency of the piezoelectric transformer element 11 in some way by a frequency not smaller than plus or minus 20 kHz.

While this invention has thus far been described in conjunction with a few embodiments thereof, it will readily be possible for those skilled in the art to put this invention into practice in various other manners. For example, each of the upper and the lower cases 21 and 22 may be, for example, of zenite manufactured and sold by Dupont. The plated layer of each of the upper and the lower conductive leads 21 and 22 may have a thickness of 2 to 5 micrometers and may be composed of, for example, nickel.

What is claimed is:

1. A piezoelectric transformer unit for transforming an input voltage into an output voltage, said piezoelectric transformer unit comprising:

a package which defines a hollow space therein;

a piezoelectric transformer element accommodated in the hollow space of the package;

a plurality of input electrodes attached to said piezoelectric transformer element;

a plurality of input conductive leads electrically connected to said input electrodes and extended through the package outside of the package, the input conductive leads having an eigen frequency higher than an audible frequency;

a plurality of output electrodes attached to said piezoelectric transformer element and remote from said input electrodes; and a plurality of output conductive leads electrically connected to said output electrodes and extended through the package outside of the package, said output conductive leads having an eigen frequency higher than an audible frequency;

the package being of resin material, the input conductive leads and the output conductive leads molded to the package to provide molded portions supported by the resin material.

2. A piezoelectric transformer unit as claimed in claim 1, wherein the piezoelectric transformer element is driven by a drive frequency which is given as the input voltage.

3. A piezoelectric transformer unit as claimed in claim 2, wherein a difference between the eigen and the drive frequencies is not smaller than 20 kHz.

4. A piezoelectric transformer unit for transforming an input voltage into an output voltage, said piezoelectric transformer unit comprising:

a package which defines a hollow space therein;

a piezoelectric transformer element accommodated in the hollow space of the package;

a first electrode member extended from said piezoelectric transformer element outside of said package to generate said output voltage;

a second electrode member extended from said piezoelectric transformer element outside of said package to generate said output voltage;

said piezoelectric transformer being polarized so that three nodes appear thereon;

said first and second electrodes in contact with said three nodes.

5. A piezoelectric transformer unit as claimed in claim 4, wherein the first electrode member comprises:

input electrodes covering two of the three nodes; and two pairs of input conductive leads brought into contact with the input electrodes and extended through the package outside of the package;

the second electrode member comprising:

output electrodes covering the remaining one of the three nodes; and a single pair of output conductive leads brought into contact with the output electrodes and extended through the package outside of the package.

6. A piezoelectric transformer unit as claimed in claim 5, wherein each pair of the input and the output conductive leads acts as a leaf spring to support the piezoelectric transformer element and has a spring constant which is substantially equal to each other.

* * * * *